(12) United States Patent
Tanaka et al.

(10) Patent No.: US 7,790,988 B2
(45) Date of Patent: Sep. 7, 2010

(54) HERMETIC SEALING CAP, ELECTRONIC COMPONENT ACCOMMODATION PACKAGE, AND METHOD FOR PRODUCING HERMETIC SEALING CAP

(75) Inventors: Tsuyoshi Tanaka, Izumi (JP); Masaharu Yamamoto, Izumi (JP)

(73) Assignee: Neomax Materials Co., Ltd., Suita-shi (JP)

( * ) Notice: Subject to any disclaimer, the term of this patent is extended or adjusted under 35 U.S.C. 154(b) by 515 days.

(21) Appl. No.: 11/915,914

(22) PCT Filed: Feb. 13, 2007

(86) PCT No.: PCT/JP2007/052461
§ 371 (c)(1),
(2), (4) Date: Nov. 29, 2007

(87) PCT Pub. No.: WO2007/094284
PCT Pub. Date: Aug. 23, 2007

(65) Prior Publication Data
US 2009/0301749 A1    Dec. 10, 2009

(30) Foreign Application Priority Data
Feb. 15, 2006    (JP) ............................. 2006-037767

(51) Int. Cl.
*H01L 23/02* (2006.01)
*H05K 5/06* (2006.01)
(52) U.S. Cl. ........................ 174/564; 257/704; 438/119; 438/121
(58) Field of Classification Search ................. 174/520, 174/559, 564; 257/704; 438/119, 121
See application file for complete search history.

(56) References Cited
U.S. PATENT DOCUMENTS
5,268,533 A * 12/1993 Kovacs et al. ............... 174/562

(Continued)

FOREIGN PATENT DOCUMENTS
JP        1-165649 U        11/1989

(Continued)

OTHER PUBLICATIONS
International Search Report of PCT/JP2007/052461, date of mailing Mar. 13, 2007.

*Primary Examiner*—Hung V Ngo
(74) *Attorney, Agent, or Firm*—Westerman, Hattori, Daniels & Adrian, LLP

(57) ABSTRACT

A hermetic sealing cap can be provided which is capable of suppressing that a production process becomes complicated, and additionally of suppressing that a solder layer wetly spreads inward on a sealing surface. This hermetic sealing cap (1, 30) includes a base member (2), a first plating layer (3, 31) that is formed on the surface of the base member, and a second plating layer (4, 32) that is formed on the surface of the first plating layer and is less oxidized than the first plating layer, wherein a part of the second plating layer in an area (S1, S5) inside an area (S2, S6) to which an electronic component accommodation member is joined is removed so that the surface of the first plating layer is exposed, and the surface of the first plating layer that is exposed in the area from which the second plating layer is removed is oxidized.

16 Claims, 10 Drawing Sheets

U.S. PATENT DOCUMENTS

| | | | | |
|---|---|---|---|---|
| 5,572,065 | A | * | 11/1996 | Burns .......................... 257/666 |
| 5,901,050 | A | * | 5/1999 | Imai ............................ 361/820 |
| 5,956,576 | A | * | 9/1999 | Toy et al. ..................... 438/125 |
| 6,538,312 | B1 | * | 3/2003 | Peterson et al. ............. 257/680 |
| 6,747,350 | B1 | * | 6/2004 | Lin et al. ..................... 257/704 |
| 6,759,590 | B2 | * | 7/2004 | Stark ........................... 174/539 |
| 2002/0024131 | A1 | * | 2/2002 | Sasano ........................ 257/704 |
| 2004/0046245 | A1 | * | 3/2004 | Minervini ................... 257/704 |
| 2007/0001287 | A1 | * | 1/2007 | Bosco et al. ................. 257/704 |

FOREIGN PATENT DOCUMENTS

| | | |
|---|---|---|
| JP | 4-96256 A | 3/1992 |
| JP | 5-167377 A | 7/1993 |
| JP | 3021399 B2 | 3/2000 |
| JP | 3432988 B2 | 8/2003 |
| JP | 2005-302990 A | 10/2005 |

* cited by examiner

COMPARATIVE EXAMPLE 1

HERMETIC SEALING CAP, ELECTRONIC COMPONENT ACCOMMODATION PACKAGE, AND METHOD FOR PRODUCING HERMETIC SEALING CAP

TECHNICAL FIELD

This present invention relates to a hermetic sealing cap, an electronic component accommodation package, and a method for producing a hermetic sealing cap, and particularly to a hermetic sealing cap, an electronic component accommodation package, and a method for producing a hermetic sealing cap that are used to accommodate an electronic component.

BACKGROUND ART

Electronic component accommodation packages such as SMD (Surface Mount Device) packages (surface mount type device packages) are conventionally known which are used to hermetically seal electronic components such as SAW filters (Surface Acoustic Wave filters), quartz resonators and oscillators that are used for noise elimination of mobile phones and the like. This type of electronic component accommodation package includes an electronic component accommodation member (case) to which an electronic component is mounted, and a hermetic sealing cap that hermetically seals the electronic component accommodation member. This hermetic sealing cap is heated to melt a solder layer, and thus joined to the electronic component accommodation member. For this reason, the hermetic sealing cap is configured to have high solder wettability. Accordingly, when the hermetic sealing cap is used to provide hermetic sealing, the solder layer may wetly spread on a sealing surface of the hermetic sealing cap. If the solder layer thus wetly spreads on the sealing surface of the hermetic sealing cap, solder between the hermetic sealing cap and the electronic component accommodation member may be insufficient, which in turn causes a disadvantage that hermeticity decreases. In addition, if the solder layer wetly spreads inward on the sealing surface of the hermetic sealing cap, this may cause a disadvantage that the solder layer comes in contact with bonding wire that connects the electronic component and the electronic component accommodation member. Additionally, in the case where an electronic component such as a quartz resonator and an oscillator is accommodated, if the solder layer wetly spreads inward on the sealing surface of the hermetic sealing cap, the solder that wetly spreads inward may splatter and adhere onto the electronic component such as a quartz resonator and an oscillator. Such adhesion or the like may cause a disadvantage that the frequency characteristic of the electronic component varies or deteriorates. Hence, a hermetic sealing cap is proposed until now which suppresses that the solder layer wetly spreads inward on a sealing surface of the hermetic sealing cap when the hermetic sealing cap is used to provide hermetic sealing. This type of hermetic sealing cap is disclosed in Japanese Patent Laying-Open No. HEI 4-96256, for example.

The aforementioned Japanese Patent Laying-Open No. HEI 4-96256 discloses a metallic hermetic sealing cover (hermetic sealing cap) that has a sealing surface that is provided with an electronic component accommodation member joined thereon and is plated with Ni, and an area inside the area to which the electronic component accommodation member is joined and is oxidized by using laser. In this metallic hermetic sealing cover, since the area inside the area to which the electronic component accommodation member is joined is oxidized by using laser, the solder wettability of the oxidized area in the metallic hermetic sealing cover decreases. Accordingly, it is possible to suppress that the solder layer wetly spreads inward on the sealing surface of the metallic hermetic sealing cover, when the metallic hermetic sealing cover is used to hermetically seal the electronic component accommodation member. In addition, in the aforementioned Japanese Patent Laying-Open No. HEI 4-96256, in order to suppress that an area of the metallic hermetic sealing cover to which the electronic component accommodation member is joined is oxidized, the area of the metallic hermetic sealing cover to which the electronic component accommodation member is joined is masked by using an aluminum plate when the area of the metallic hermetic sealing cover inside the area to which the electronic component accommodation member is joined is oxidized by using laser.

However, since, in the aforementioned Japanese Patent Laying-Open No. HEI 4-96256, in order to suppress that the area of the metallic hermetic sealing cover to which the electronic component accommodation member is joined is oxidized, the area of the metallic hermetic sealing cover to which the electronic component accommodation member is joined is masked by using an aluminum plate when the area of the metallic hermetic sealing cover inside the area to which the electronic component accommodation member is joined is oxidized by using laser, there is a disadvantage that requires a mask forming stage and a mask removing stage. For this reason, there is a problem that makes a production process complicated. In addition, in the case where the area of the metallic hermetic sealing cover to which the electronic component accommodation member is joined is not masked by using an aluminum plate for suppression of oxidation, since Ni plating of the area of the metallic hermetic sealing cover to which the electronic component accommodation member is joined is likely oxidized, there is a disadvantage that the joining characteristic by the solder decreases caused by solder wettability reduction in the area of the metallic hermetic sealing cover to which the electronic component accommodation member is joined.

DISCLOSURE OF INVENTION

The present invention is aimed at solving the above issues, and it is one object of the present invention to provide a hermetic sealing cap, an electronic component accommodation package, and a method for producing a hermetic sealing cap that are capable of suppressing that a production process becomes complicated, and additionally of suppressing that a solder layer wetly spreads inward on a sealing surface.

A hermetic sealing cap according to a first aspect of the present invention is a hermetic sealing cap that is used for an electronic component accommodation package that includes an electronic component accommodation member for accommodating an electronic component, and includes a base member; a first plating layer that is formed on the surface of the base member; and a second plating layer that is formed on the surface of the first plating layer and is less oxidized than the first plating layer, wherein at least a part of the second plating layer in an area inside an area to which the electronic component accommodation member is joined is removed so that the surface of the first plating layer is exposed, and the surface of the first plating layer that is exposed in the area from which the second plating layer is removed is oxidized.

In the hermetic sealing cap according to the first aspect of the present invention, as stated above, since at least a part of the second plating layer in the area inside the area to which the electronic component accommodation member is joined is removed so that the surface of the first plating layer is exposed, and the surface of the first plating layer that is exposed in the area from which the second plating layer is removed is oxidized, the solder wettability of the first plating layer in the oxidized area can be low. Therefore, it is possible to suppress that the solder layer wetly spreads inward on the first plating layer of the hermetic sealing cap when the electronic component accommodation member is hermetically sealed. In addition, since the second plating layer that is formed on the surface of the first plating layer and is less oxidized than the first plating layer is provided, when the surface of the first plating layer is exposed and oxidized, it is not necessary to mask the area of the second plating layer to which the electronic component accommodation member is joined to suppress oxidation of the surface of the area of the second plating layer to which the electronic component accommodation member is joined. Therefore, it is possible to suppress that a production process of a hermetic sealing cap becomes complicated.

In the aforementioned hermetic sealing cap according to the first aspect, it is preferable that the first plating layer is an Ni plating layer, and the second plating layer is an Au plating layer. This constitution can make it easy to oxidize the surface of the first plating layer, and thus to reduce the solder wettability of the area where the first plating layer is oxidized. In addition, since the first plating layer is composed of an Ni plating layer, and the second plating layer is composed of an Au plating layer that is less oxidized than the Ni plating layer, the second plating layer that is less oxidized than the first plating layer can be easily formed on the surface of the first plating layer.

In this case, a solder layer that is composed of an Au—Sn group alloy is preferably formed on the surface of at least one of the first plating layer and the second plating layer in the area to which the electronic component accommodation member is joined. In the case of this constitution, the solder layer can be easily melted and joined on the surface of at least one of the first plating layer and the second plating layer.

In the aforementioned hermetic sealing cap according to the first aspect, the area of the first plating layer that is exposed and oxidized is preferably formed in a ring shape as viewed in a plan view. In the case of this constitution, since, as compared with the case where the second plating layer is removed from the whole area inside the area to which the electronic component accommodation member is joined, a removal area can be small. Therefore, for example, in the case where the second plating layer is removed by using laser or the like, it is possible to shorten the time of a stage that is required to remove the second plating layer.

In the aforementioned hermetic sealing cap according to the first aspect, the second plating layer is preferably formed on an area inside the area of the first plating layer that is exposed and oxidized. In the case of this constitution, the second layer can suppress corrosion of the first plating layer in an area inside the area that is exposed and oxidized.

In the aforementioned hermetic sealing cap according to the first aspect, in the boundary between the area of the first plating layer that is exposed and oxidized, and the area to which the electronic component accommodation member is joined, the boundary at corners of the hermetic sealing cap is preferably located outside the boundary in other areas other than the corners of the hermetic sealing cap. In the case of this constitution, at the corners of the hermetic sealing cap, it is possible to suppress an inward increase of the area to which the electronic component accommodation member is joined, therefore, it is possible to suppress an increase of the area to which the electronic component accommodation member is joined. Accordingly, in the case where a solder layer is formed on the area to which the electronic component accommodation member is joined, it is possible to suppress that solder collects at corners of the area to which the electronic component accommodation member is joined. Therefore, it is possible to suppress that the thicknesses of the solder layer at the corners of the area to which the electronic component accommodation member is joined become larger as compared with the thicknesses of the solder layer in other areas other than the corners of the area to which the electronic component accommodation member is joined.

In the aforementioned hermetic sealing cap according to the first aspect, the area of the first plating layer that is exposed and oxidized is preferably formed in a groove shape with a prescribed depth. In the case of this constitution, in the case where the second plating layer is removed to expose the first plating layer, it is possible to ensure that the second plating layer is removed to expose the first plating layer.

An electronic component accommodation package according to a second aspect of the present invention includes a hermetic sealing cap that includes a base member, a first plating layer that is formed on the surface of the base member, and a second plating layer that is formed on the surface of the first plating layer and is less oxidized than the first plating layer, wherein at least a part of the second plating layer in an area inside an area to which an electronic component accommodation member is joined is removed so that the surface of the first plating layer is exposed, and the surface of the first plating layer that is exposed in the area from which the second plating layer is removed is oxidized; and the electronic component accommodation member that is sealed by the hermetic sealing cap and accommodates an electronic component. In the case of this constitution, it is possible to provide an electronic component accommodation package that includes a hermetic sealing cap capable of suppressing that a production process becomes complicated, and additionally of suppressing that a solder layer wetly spreads inward on a sealing surface.

A method for producing a hermetic sealing cap according to a third aspect of the present invention that is used for an electronic component accommodation package that includes an electronic component accommodation member for accommodating an electronic component includes steps of preparing a base member; forming a first plating layer on the surface of the base member; forming a second plating layer being less oxidized than the first plating layer on the surface of the first plating layer; and oxidizing the surface of the first plating layer that is exposed by removing at least a part of the second plating layer in an area inside an area to which the electronic component accommodation member is joined so that the surface of the first plating layer is exposed.

As stated above, since the method for producing a hermetic sealing cap according to the third aspect of the present invention includes the step of oxidizing the surface of the first plating layer that is exposed by removing at least a part of the second plating layer in an area inside an area to which the electronic component accommodation member is joined so that the surface of the first plating layer is exposed, the solder wettability of the first plating layer in the oxidized area can be low. Therefore, it is possible to suppress that the solder layer wetly spreads inward on the first plating layer of the hermetic sealing cap when the electronic component accommodation member is hermetically sealed. In addition, since the step of forming a second plating layer on the surface of the first plating layer, the second plating layer being less oxidized than the first plating layer is included, when the surface of the first plating layer is exposed and oxidized, it is not necessary to mask the area of the second plating layer to which the electronic component accommodation member is joined to suppress oxidation of the surface of the area of the second plating layer to which the electronic component accommodation member is joined. Therefore, it is possible to suppress that a production process of a hermetic sealing cap becomes complicated.

In the method for producing a hermetic sealing cap according to the third aspect, the method preferably includes the step of forming the first plating layer includes a step of forming the first plating layer that is composed of an Ni plating layer, and the step of forming the second plating layer includes a step of forming the second plating layer that is composed of an Au plating layer. This constitution can make it easy to oxidize the surface of the first plating layer that is composed of an Ni plating layer, and thus to reduce the solder wettability of the area where the first plating layer is oxidized. In addition, since the step of forming the first plating layer that is composed of an Ni plating layer, and the step of forming the second plating layer that is composed of an Au plating layer are included, the second plating layer that is less oxidized than the first plating layer can be easily formed on the surface of the first plating layer.

In this case, a step of joining a solder layer that is composed of an Au—Sn group alloy on the surface of the second plating layer in the area to which the electronic component accommodation member is joined by melting the solder layer is preferably further included. In the case of this constitution, the solder layer can be easily formed on the surface of hermetic sealing cap in the area to which the electronic component accommodation member is joined.

In the method for producing a hermetic sealing cap according to the third aspect, the step of oxidizing the surface of the first plating layer preferably includes a step of exposing the surface of the first plating layer by removing at least a part of the second plating layer by using laser without masking the second plating layer in the area to which the electronic component accommodation member is joined. This constitution can make it easy to suppress complication of a production process caused by mask formation, and additionally to oxidize the surface of the first plating layer by removing at least a part of the second plating layer in the area inside an area to which the electronic component accommodation member is joined.

In the method for producing a hermetic sealing cap according to the third aspect, the step oxidizing the surface of the first plating layer preferably includes a step of exposing and oxidizing the surface of the first plating layer in a ring shape. In the case of this constitution, since, as compared with the case where the second plating layer is removed from the whole area inside the area to which the electronic component accommodation member is joined, a removal area can be small. Therefore, for example, in the case where the second plating layer is removed by using laser or the like, it is possible to shorten the time of a stage that is required to remove the second plating layer.

In the method for producing a hermetic sealing cap according to the third aspect, the step of removing at least a part of the second plating layer preferably includes a step of removing the second plating layer with leaving the second plating layer inside the area from which the second plating layer is removed in place. In this constitution, the second layer can suppress corrosion of the first plating layer in an area inside the area that is exposed and oxidized.

In the method for producing a hermetic sealing cap according to the third aspect, the step of oxidizing the surface of the first plating layer that is exposed preferably includes a step of forming the area of the first plating layer that is exposed and oxidized so that the boundary between the area of the first plating layer that is exposed and oxidized, and the area to which the electronic component accommodation member is joined at corners of the hermetic sealing cap is located outside the boundary in other areas other than the corners of the hermetic sealing cap. In the case of this constitution, at the corners of the hermetic sealing cap, it is possible to suppress an inward increase of the area to which the electronic component accommodation member is joined, therefore, it is possible to suppress an increase of the area to which the electronic component accommodation member is joined. Accordingly, in the case where a solder layer is formed on the area to which the electronic component accommodation member is joined, it is possible to suppress that solder collects at corners of the area to which the electronic component accommodation member is joined. Therefore, it is possible to suppress that the thicknesses of the solder layer at the corners of the area to which the electronic component accommodation member is joined become larger as compared with the thicknesses of the solder layer in other areas other than the corners of the area to which the electronic component accommodation member is joined.

In the method for producing a hermetic sealing cap according to the third aspect, the step of exposing the surface of the first plating layer by removing at least a part of the second plating layer preferably includes a step of removing at least a part of the second plating layer and removing also a part of the surface of the first plating layer at a prescribed depth. In the case of this constitution, in the case where the second plating layer is removed to expose the first plating layer, it is possible to ensure that the second plating layer is removed to expose the first plating layer.

BEST MODE FOR CARRYING OUT THE INVENTION

Embodiments of the present invention are now described with reference to the drawings.

First Embodiment

The structure of an electronic component accommodation package according to a first embodiment is first described with reference to FIG. 1.

Figure 1:
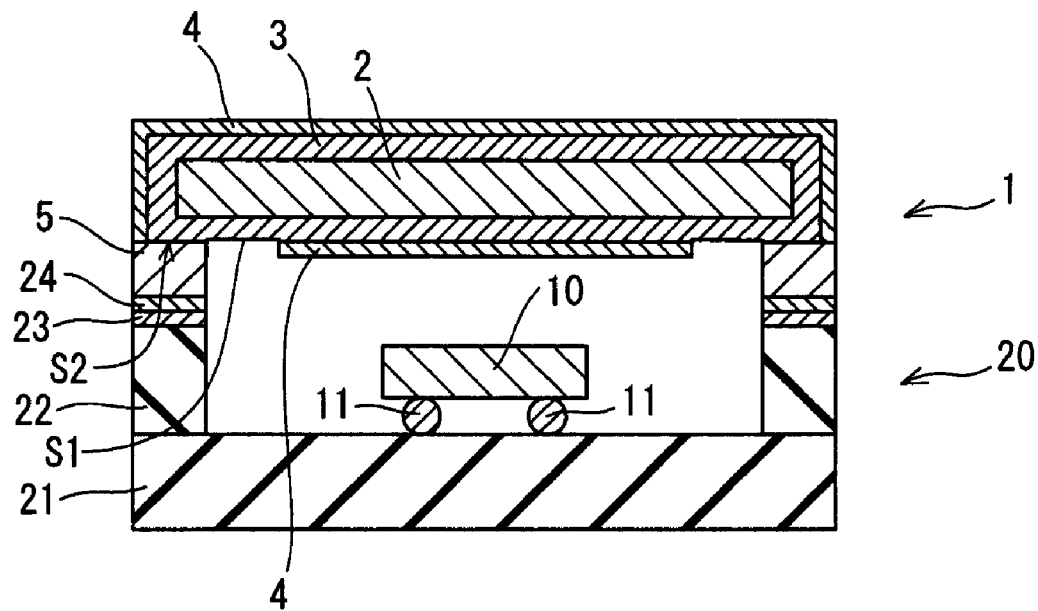
FIG. 1 Sectional view showing the structure of an electronic component accommodation package according to a first embodiment of the present invention.

As shown in FIG. 1, the electronic component accommodation package according to the first embodiment of the present invention is composed of a hermetic sealing cap 1, an electronic components 10 such as a quartz resonator, and an electronic component accommodation member 20 for accommodating the electronic component 10. This electronic component accommodation member 20 includes a ceramic substrate 21 that is composed of an insulating material such as alumina, and a ceramic frame 22 that provides accommodation space on a prescribed area of the surface of the ceramic substrate 21 and is formed of an insulating material such as alumina. In addition, the electronic component 10 is mounted via bumps 11 on the ceramic substrate 21 that is located in the accommodation space that is enclosed by the ceramic frame 22. Additionally, a tungsten layer 23 and an Ni—Co alloy layer 24 are formed on the upper surface of the ceramic frame 22. The Ni—Co alloy layer 24 on the upper surface of the ceramic frame 22 is joined to a later-described solder layer 5 of the hermetic sealing cap 1.

Figure 3:
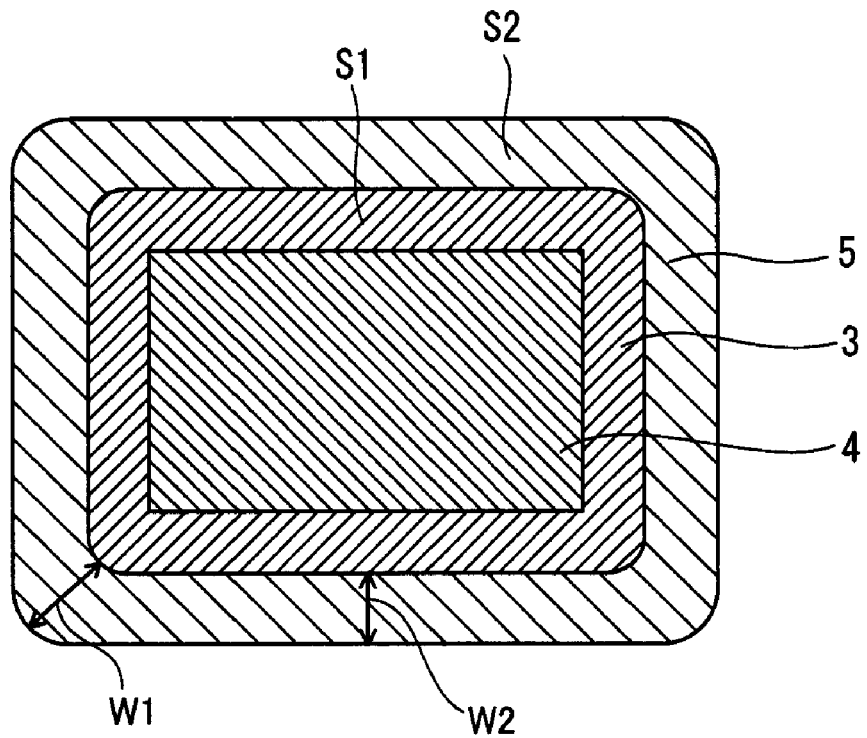
FIG. 3 Bottom view showing the structure of the hermetic sealing cap according to the first embodiment of the present invention.
Figure 4:
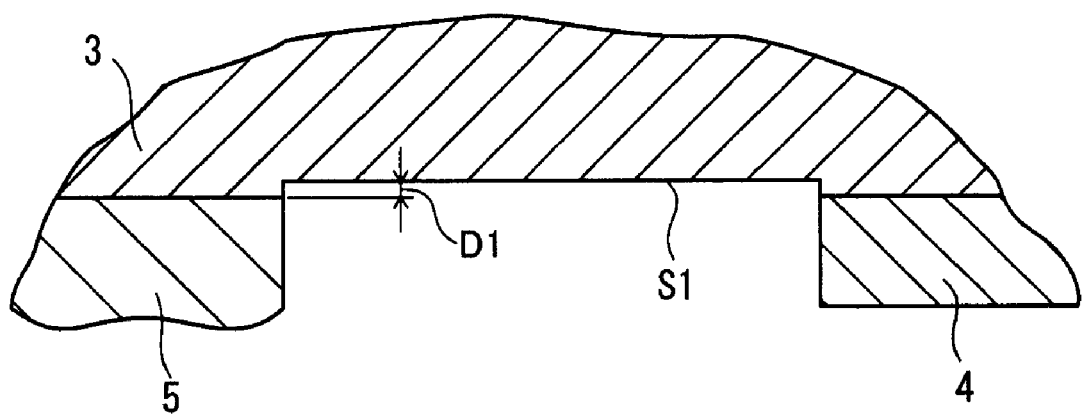
FIG. 4 Sectional view showing the detailed structure of the hermetic sealing cap according to the first embodiment of the present invention.

The structure of the hermetic sealing cap 1 according to the first embodiment is now described with reference to FIGS. 2 to 4.

Figure 2:
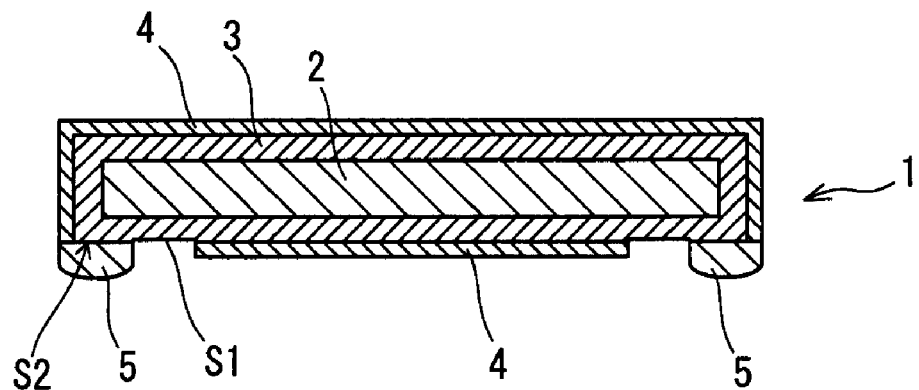
FIG. 2 Sectional view showing the structure of a hermetic sealing cap according to the first embodiment of the present invention.

As shown in FIG. 2, the hermetic sealing cap 1 according to the first embodiment of the present invention includes a base material 2 that is composed of an Fe—Ni—Co alloy, an Ni plating layer 3 that is formed to enclose the base material 2 and includes an oxidized area S1, an Au plating layer 4 that is formed on a prescribed area of the surface of the Ni plating layer 3, and a solder layer 5 that is composed of an Au—Sn alloy and is formed in a joining area S2. In addition, the Ni plating layer 3 is an example of a "first plating layer" in the present invention, and the Au plating layer 4 is an example of a "second plating layer" in the present invention.

Specifically, the base material 2 is formed in about 1.85 mm (length)×about 2.35 mm (width) and in a thickness of about 0.08 mm. In addition, the Ni plating layer 3 is formed in a thickness of about 2 μm. In addition, the surface of the Ni plating layer 3 in a portion that is located in the oxidized area S1 (see FIG. 3) is oxidized. Accordingly, in the oxidized area S1 on the bottom surface of the Ni plating layer 3, the solder wettability decreases. In addition, as shown in FIG. 4, the oxidized area S1 of the Ni plating layer 3 is formed in a groove shape with a depth D1 (about 0.1 μm). In addition, as shown in FIG. 3, the oxidized area S1 of the Ni plating layer 3 is formed in a ring shape with a width of about 0.20 mm as viewed in a plan view. In addition, the Au plating layer 4 is formed in a thickness of about 0.02 μm, and its surface is less oxidized as compared with the Ni plating layer 3. In addition, as shown in FIGS. 2 and 3, the Au plating layer 4 is disposed on the side and upper surfaces of the Ni plating layer 3, and an area inside the oxidized area S1 on the bottom surface of the Ni plating layer 3. In addition, before the solder layer 5 is melted for joining, the Au plating layer 4 is formed in the joining area S2 and then, when the solder layer 5 is melted for joining, Au in the Au plating layer 4 diffuses into the solder layer 5, thus, after the solder layer 5 is melted for joining, the solder layer 5 will be formed on the surface of the Ni plating layer 3. In addition, as shown in FIG. 3, the solder layer 5 is formed on the bottom surface of the Ni plating layer 3 in the joining area S2 to which the electronic component accommodation member 20 is joined. In addition, the solder layer 5 has a width of W1 of about 0.36 mm at four corners of the hermetic sealing cap 1, and has a width W2 of about 0.25 mm in other parts other than the corners of the hermetic sealing cap 1 as viewed in a plan view.

A method for producing the hermetic sealing cap 1 according to the first embodiment is now described with reference to FIGS. 1, 2, and 4 to 10.

Figure 5:
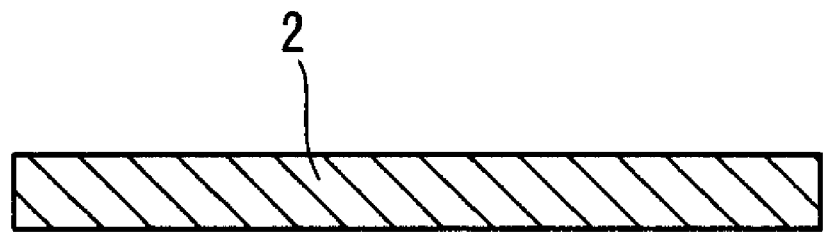
FIG. 5 Sectional view illustrating a method for producing the hermetic sealing cap according to the first embodiment of the present invention shown in FIG. 2.
Figure 6:
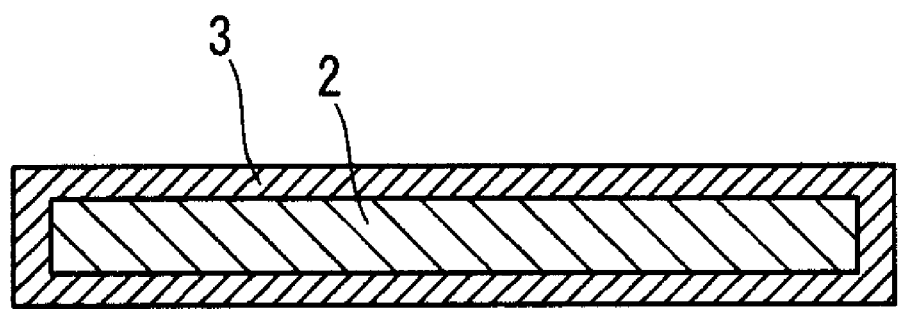
FIG. 6 Sectional view illustrating the method for producing the hermetic sealing cap according to the first embodiment of the present invention shown in FIG. 2.
Figure 7:
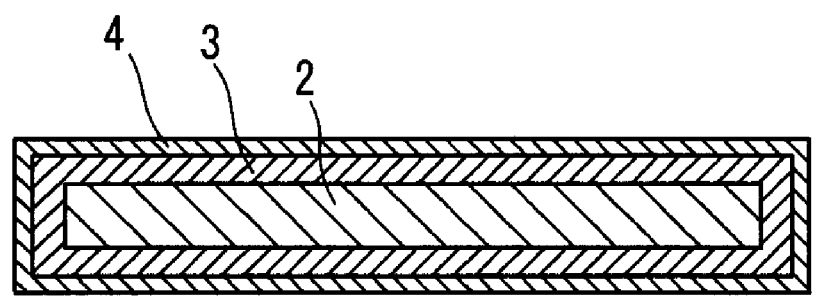
FIG. 7 Sectional view illustrating the method for producing the hermetic sealing cap according to the first embodiment of the present invention shown in FIG. 2.

As shown in FIG. 5, a plate-shaped coil that is composed of an Fe—Ni—Co alloy is first stamped by press working so that the base material 2 is formed in about 1.85 mm (length)× about 2.35 mm (width) and in a thickness of about 0.08 mm. As shown in FIG. 6, the Ni plating layer 3 is formed on the whole surface of this base material 2 in a thickness of about 2 μm. As shown in FIG. 7, the Au plating layer 4 is then formed on the whole surface of the Ni plating layer 3 in a thickness of about 0.02 μm.

Figure 8:
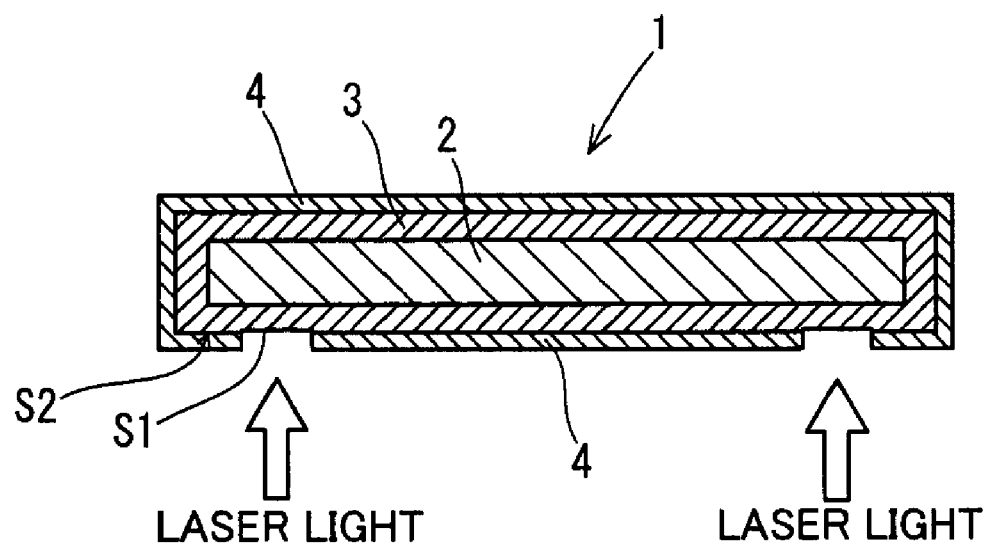
FIG. 8 Sectional view illustrating the method for producing the hermetic sealing cap according to the first embodiment of the present invention shown in FIG. 2.
Figure 9:
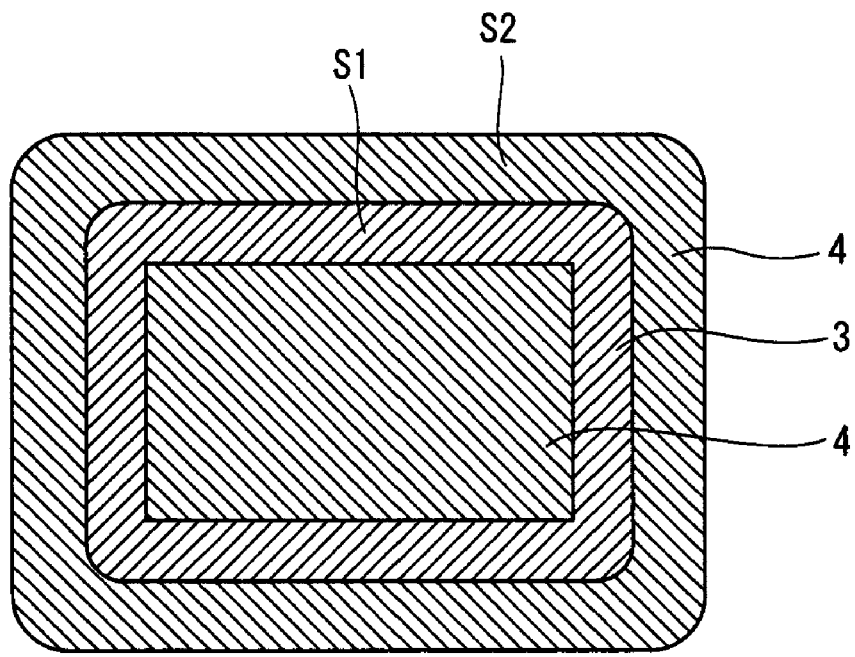
FIG. 9 Sectional view illustrating the method for producing the hermetic sealing cap according to the first embodiment of the present invention shown in FIG. 2.

Subsequently, as shown in FIGS. 8 and 9, the Au plating layer 4 that is located in the oxidized area S1 is removed in a width of about 0.20 mm, and a part of the surface of the Ni plating layer 3 is also removed in a depth of about 0.1 μm (D1) in an area inside the joining area S2 (see FIG. 9) on the bottom surface of the Au plating layer 4 to which the electronic component accommodation member 20 (see FIG. 1) is joined by using laser of a medium YVO$_4$ (Yttrium Vanadium tera Oxide) at a laser intensity of about 10 W. In this time, the surface of the Ni plating layer 3 that is exposed by removing the Au plating layer 4 is oxidized in a short time by heat caused by laser irradiation. Thus, the surface of the Ni plating layer 3 is oxidized in the oxidized area S1.

Figure 10:
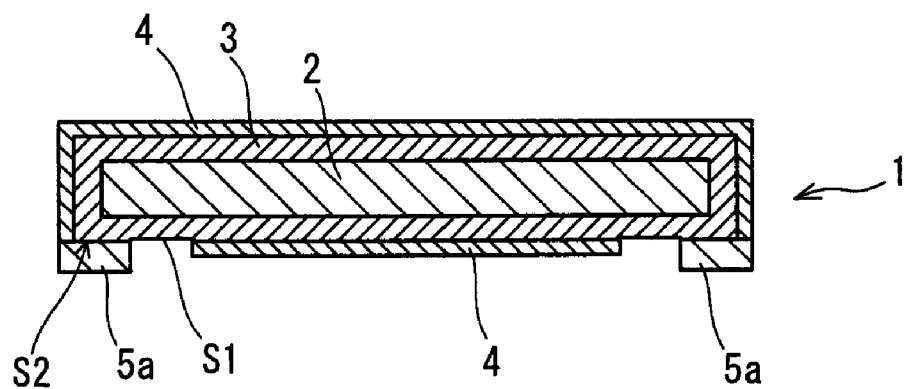
FIG. 10 Sectional view illustrating the method for producing the hermetic sealing cap according to the first embodiment of the present invention shown in FIG. 2.

Subsequently, as shown in FIG. 10, solder 5a that is composed of an Au—Sn alloy (Au: about 80 mass %), and has a ring shape that has an outline with about 1.85 mm (length)× about 2.35 mm (width), an opening with about 1.55 mm (length)×about 2.05 mm (width), and a thickness of about 0.025 mm to about 0.038 mm is arranged on the surface of the joining area S2 in the bottom surface of the Au plating layer 4. Then, the solder 5a is then melted at a temperature of about 280° C. to about 320° C. in an atmosphere of an $N_2$ gas and an $H_2$ gas, as a result, as shown in FIG. 2, the solder layer 5 with a prescribed thickness is formed on the joining area S2 to which the electronic component accommodation member 20 is joined. In this time, the Au plating layer 4 in the joining area S2 is diffused into the solder layer 5 that is composed of an Au—Sn alloy. For this reason, after melted, the solder layer 5 is configured in like a structure in which it is formed on the surface of the Ni plating layer 3. Consequently, the hermetic sealing cap 1 according to the first embodiment of the present invention is formed.

A method for producing the electronic component accommodation package according to the first embodiment is now described with reference to FIGS. 1 and 11.

Figure 11:
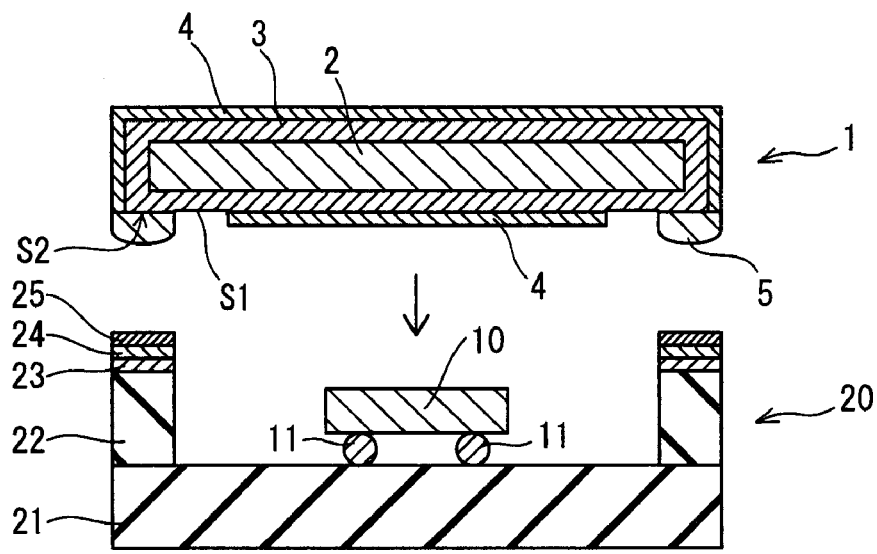
FIG. 11 Sectional view illustrating a method for producing the electronic component accommodation package using the hermetic sealing cap shown in FIG. 1.

As shown in FIG. 11, the electronic component accommodation member 20 is first prepared which includes a tungsten layer 23, an Ni—Co alloy layer 24, and an Au layer 25 that are formed in this order on the upper surface of the ceramic frame 22 that is arranged on the ceramic substrate 21. After that, the electronic component 10 that includes the bumps 11 is mounted on the upper surface of the ceramic substrate 21. The solder layer 5 of the hermetic sealing cap 1 that is formed by the aforementioned method is then arranged to come in contact with the upper surface of the ceramic frame 22. After that, the solder layer 5 is melted again at a temperature of about 280° C. to about 310° C. in a vacuum, thus, the hermetic sealing cap 1 is joined onto the upper surface of the ceramic frame 22. In this time, as shown in FIG. 1, the Au layer 25 (see FIG. 11) is diffused into the solder layer 5 that is composed of an Au—Sn alloy. Consequently, the electronic component accommodation package according to the first embodiment of the present invention is formed.

In the first embodiment, as stated above, since a part of the Au plating layer 4 in the oxidized area S1 inside the joining area S2 to which the electronic component accommodation member 20 of the hermetic sealing cap 1 is joined is removed so that the surface of the Ni plating layer 3 is exposed, and the surface of the Ni plating layer 3 that is exposed in the oxidized area S1 from which the Au plating layer 4 is removed is oxidized, the solder wettability of the Ni plating layer 3 in the oxidized area S1 can be low. Therefore, it is possible to suppress that the solder layer 5 wetly spreads inward on the Ni plating layer 3 of the hermetic sealing cap 1 when the electronic component accommodation member 20 is hermetically sealed. In addition, since the Au plating layer 4 that is formed on the surface of the Ni plating layer 3 and is less oxidized than the Ni plating layer 3 is provided, when the surface of the Ni plating layer 3 is exposed and oxidized, it is not necessary to mask the joining area S2 of the Au plating layer 4 to which the electronic component accommodation member 20 is joined to suppress oxidation of the surface of the joining area S2 of the Au plating layer 4 to which the electronic component accommodation member 20 is joined. Therefore, it is possible to suppress that a production process of the hermetic sealing cap 1 becomes complicated.

Furthermore, in the first embodiment, the oxidized area S1 in which the Ni plating layer 3 is exposed is formed in a ring shape. Since, as compared with the case where the Au plating layer 4 is removed from the whole area inside the joining area S2 to which the electronic component accommodation member 20 is joined, a removal area can be small. Therefore, it is possible to shorten the time that is required to remove the Au plating layer 4 in the stage from which the Au plating layer 4 is removed by using the laser.

Moreover, in the first embodiment, the Au plating layer 4 is formed in an area inside the oxidized area S1 in which the Ni plating layer 3 is exposed, therefore, the Au layer 4 can suppress corrosion of the Ni plating layer 3 in an area inside the oxidized area S1 that is exposed.

Examples

A comparative experiment is now described which has been conducted to confirm an effect of the hermetic sealing cap 1 according to the foregoing first embodiment. The comparative experiment is first described which has measured the widths and thicknesses of the solder layer before the hermetic sealing cap 1 is hermetically sealed. In this comparative experiment, samples according to examples 1 to 3 corresponding to the first embodiment, and a sample according to comparative example 1 were produced.

Figure 12:
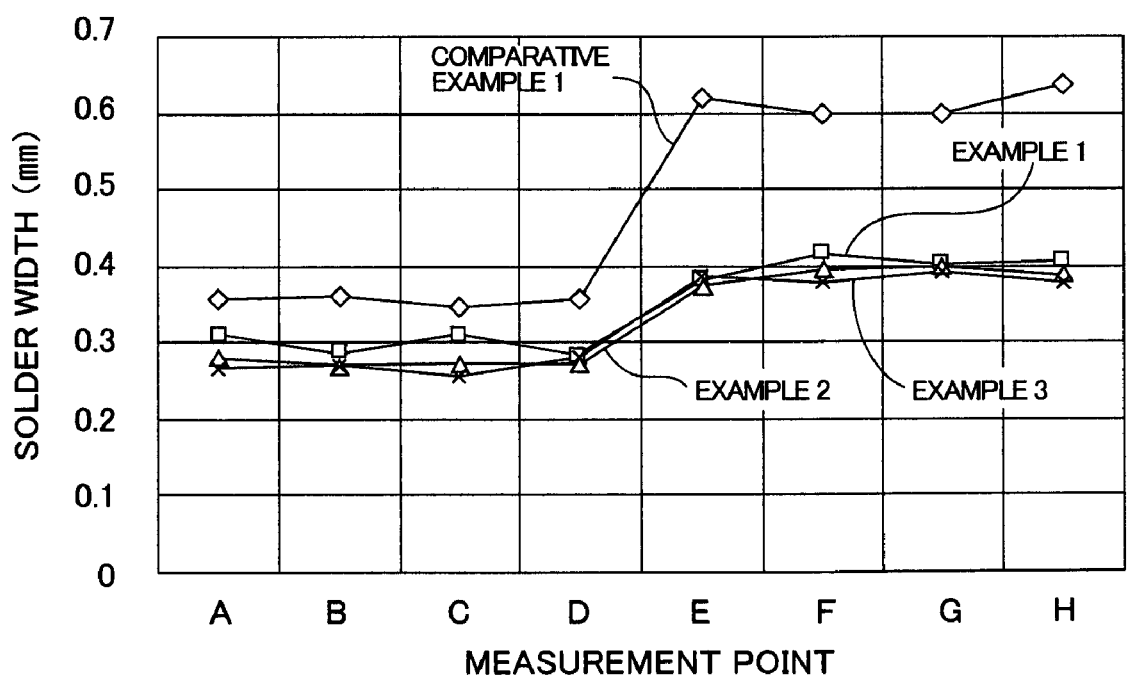
FIG. 12 View explaining an experiment that is conducted to confirm an effect of the hermetic sealing cap according to the first embodiment of the present invention.
Figure 13:
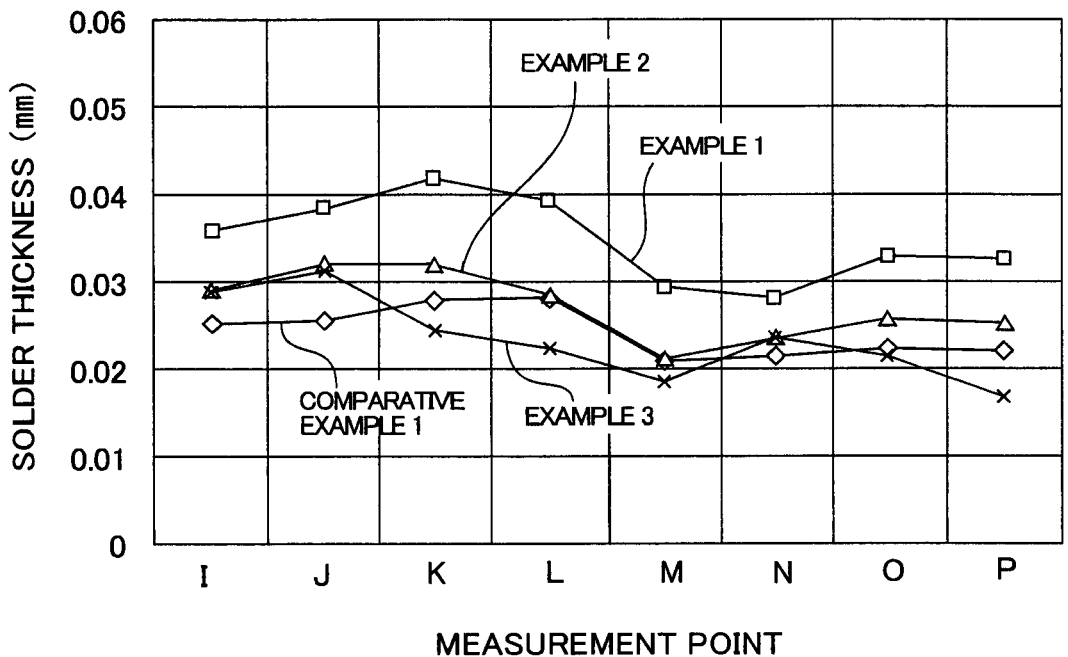
FIG. 13 View explaining the experiment that is conducted to confirm an effect of the hermetic sealing cap according to the first embodiment of the present invention.
Figure 14:
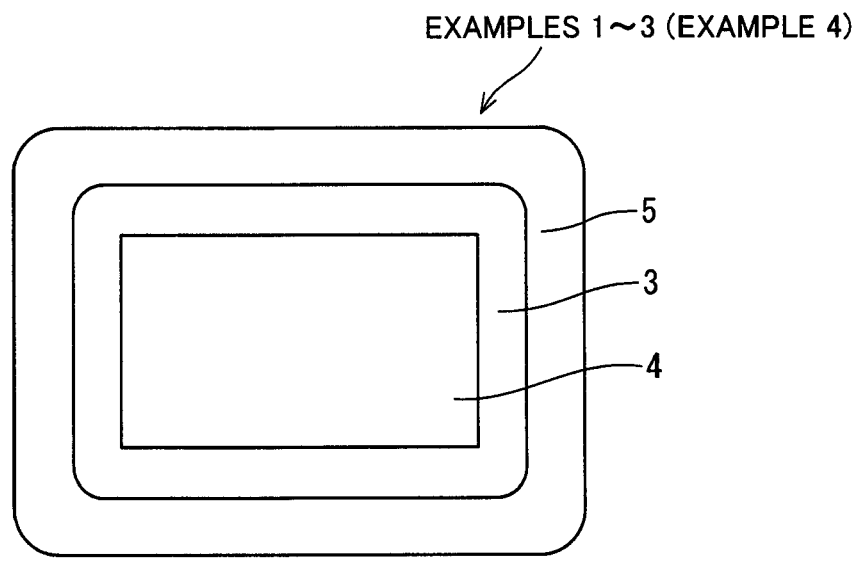
FIG. 14 View explaining the experiment that is conducted to confirm an effect of the hermetic sealing cap according to the first embodiment of the present invention.
Figure 15:
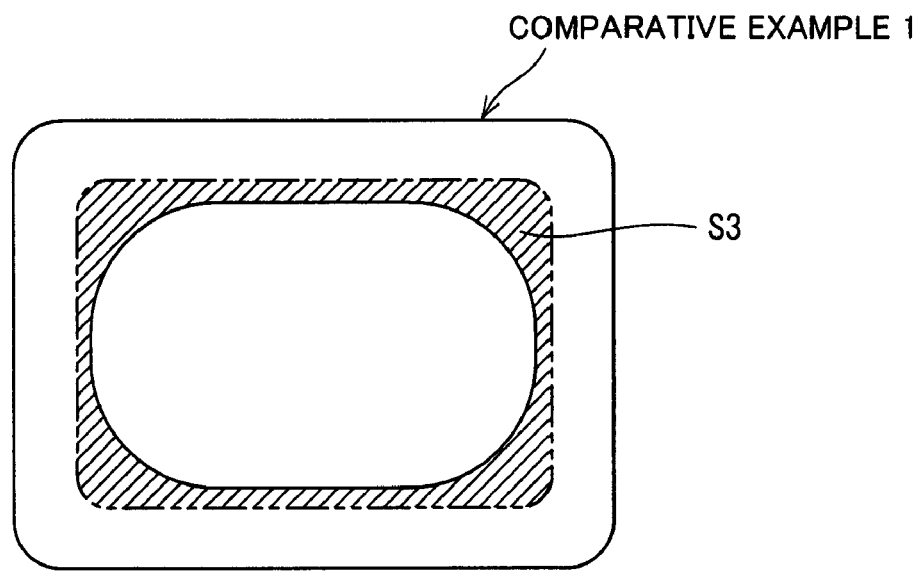
FIG. 15 View explaining the experiment that is conducted to confirm an effect of the hermetic sealing cap according to the first embodiment of the present invention.
Figure 16:
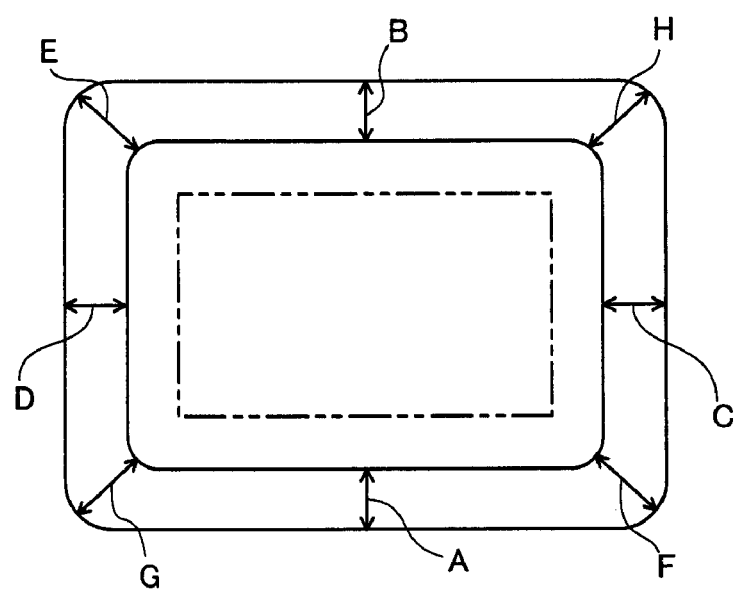
FIG. 16 View explaining the experiment that is conducted to confirm an effect of the hermetic sealing cap according to the first embodiment of the present invention.
Figure 17:
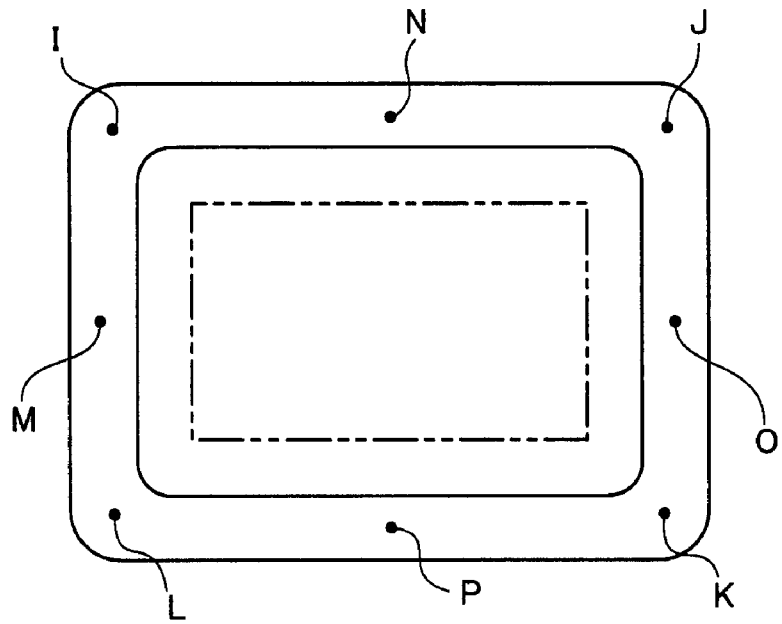
FIG. 17 View explaining the experiment that is conducted to confirm an effect of the hermetic sealing cap according to the first embodiment of the present invention.

The samples according to the examples 1 to 3 were produced by using a production process similar to the hermetic sealing cap 1 according to the foregoing first embodiment. In addition, the samples according to the examples 1 to 3 were produced by using the ring-shaped solder 5a with thicknesses of about 0.025 mm, about 0.030 mm, and about 0.038 mm, respectively. On the other hand, dissimilarly to the foregoing first embodiment, the sample according to the comparative example 1 was produced without removing the area inside the joining area S2 on the bottom surface of the Au plating layer 4 to which the electronic component accommodation member 20 is joined. In addition, the sample according to the comparative example 1 was produced by using the ring-shaped solder 5a with a thickness of about 0.038 mm. The widths and thicknesses of the solder layers were measured in these samples. FIGS. 12 and 13 show the result. In addition, how the solder layers in the samples according to the examples 1 to 3, and the sample according to the comparative example 1 wetly spread was observed. FIGS. 14 and 15 show the result. Additionally, measuring points for the widths of the solder layers (A to H), and measuring points for the thicknesses (point I to point P) are shown in FIGS. 16 and 17.

First, with reference to FIGS. 12, 14, and 15, it was found that the widths of the solder layers 5 in the samples according to the examples 1 to 3 had a similar size irrespective of each thickness of the ring-shaped solder 5a that was used to form the solder layer 5. This reason can be considered as follows. That is, in the samples according to the examples 1 to 3, it can be considered that the solder wettability has been reduced by oxidizing the oxidized area S1 inside the joining area S2 of the solder layer 5, which in turn has suppressed that the solder layer 5 has wetly spread inward on the surface of the hermetic sealing cap 1. In addition, in the sample according to the comparative example 1, it was found that, as compared with the samples according to the examples 1 to 3, the widths of the solder layer were larger, and, in particular, the widths of the solder layer were much larger at the measuring points at four corners of the hermetic sealing cap (E, F, G, and H). This reason can be considered as follows. That is, it can be considered that, in the sample according to the comparative example 1, the solder layer has been likely to wetly spread on the surface of the hermetic sealing cap, and the solder layer has been likely to wetly spread on the surface of the hermetic sealing cap in particular at the measuring points (E, F, G, and H) at four corners of the hermetic sealing cap. Additionally, a diagonally shaded area S3 in FIG. 15 shows an area where the solder layer in the sample according to the comparative example 1 has wetly been more likely to spread than the sample according to the example 1. Moreover, in the samples according to the examples 1 to 3, and the sample according to the comparative example 1, the widths of the solder layers at the measuring points (E, F, G, and H) at the four corners of the hermetic sealing cap were larger as compared with the widths of the solder layers at the measuring points (A, B, C, and D) of the centers of four sides of the hermetic sealing cap.

Subsequently, with reference to FIG. 13, it was found that the thicknesses of the solder layer 5 in the sample according to the example 1 were larger as compared with the thicknesses of the solder layer in the sample according to the comparative example 1. Specifically, the thicknesses of the solder layer 5 in the sample according to the example 1 were about 10 μm larger than the thicknesses of the solder layer in the sample according to the comparative example 1. In addition, the thicknesses of the solder layer in the sample according to the comparative example 1 were similar to the thicknesses of the solder layers 5 in the sample according to the examples 2 and 3. This reason can be considered as follows. That is, in the sample according to the comparative example 1, it can be considered that the solder layer has wetly spread on the surface of the hermetic sealing cap, thus, this spread has reduced the thicknesses of the solder layer. Moreover, in the samples according to the examples 1 to 3, and the sample according to the comparative example 1, the thicknesses of the solder layers at the measuring points (point I, point J, point K, and point L) at the four corners of the hermetic sealing cap were larger as compared with the thicknesses of the solder layers at the measuring points (point M, point N, point O, and point P) of the centers of the four sides of the hermetic sealing cap.

In addition, the oxidized areas S1 of the Ni plating layer 3 in the samples according to the examples 1 to 3 were measured by ESCA850 (manufactured by Shimadzu Corporation). In this experiment, it was found that an NiO layer (not shown) with a thickness of about 1 nm to about 2 nm was formed on the surface of the oxidized area S1 of the Ni plating layer 3. Thus, in the first embodiment, since the NiO layer with a relatively large thickness (about 1 nm to about 2 nm) has been able to be formed by oxidizing the surface of the Ni plating layer 3 by using the laser, it can be considered that the oxidized area S1 of the Ni plating layer 3 has been able to be surely oxidized. Additionally, the measurement by using ESCA850 (manufactured by Shimadzu Corporation) was conducted in conditions of X-Ray (Mg): [8 kV, and 30 mA], and ion etching (Ar): [2 kV, 20 mA, and 3.2 nm/min].

A comparative experiment is now described which has observed how the solder layer has wetly spread after the electronic component accommodation package has been produced (after hermetic sealing). In this comparative experiment, a sample according to example 4 corresponding to the first embodiment, and a sample according to comparative example 2 were produced.

Figure 18:
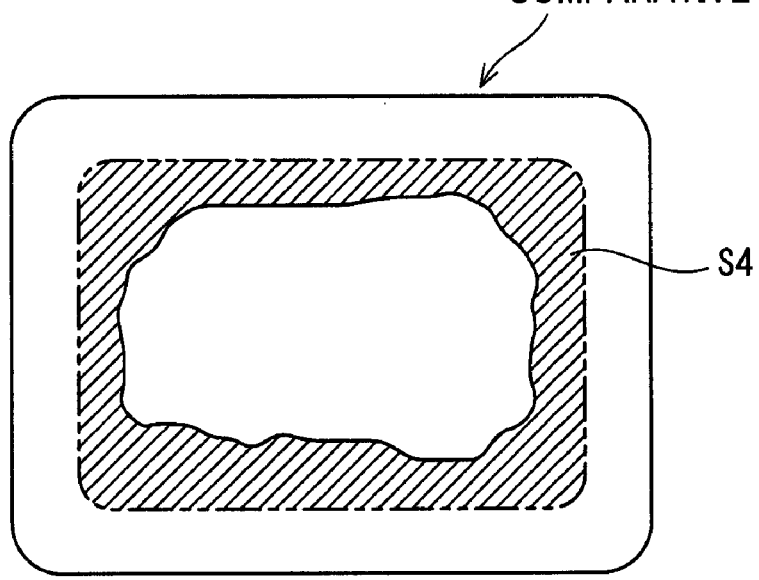
FIG. 18 View explaining the experiment that is conducted to confirm an effect of the hermetic sealing cap according to the first embodiment of the present invention.

The sample according to the example 4 was produced by using a production process similar to the electronic component accommodation package according to the foregoing first embodiment. In addition, the sample according to the example 4 was produced by using the hermetic sealing cap 1 according to the foregoing example 1. In addition, the sample according to the comparative example 2 was produced by using the sample according to the foregoing comparative example 1. Additionally, the other parts and production processes of the sample according to the comparative example 2 were similar to the sample according to the example 4. In these samples, the hermetic sealing caps were removed from the electronic component accommodation members, thus, how the solder layers wetly spread was observed. FIGS. 14 and 18 show the result.

With reference to FIGS. 14 and 18, in the sample according to the example 4, it was found that it was possible to suppress that the solder layer 5 wetly spread on the surface of the hermetic sealing cap 1 also after hermetic sealing, similarly to after the production of the hermetic sealing cap 1. In addition, in the sample according to the comparative example 2, it was found that the solder layer further wetly spread on the surface of the hermetic sealing cap also after hermetic sealing. Additionally, a diagonally shaded area S4 in FIG. 18 shows an area where the solder layer in the sample according to the comparative example 2 has wetly spread than the sample according to the example 4.

Moreover, in the samples according to the example 4 and the comparative example 2, in an experiment that measured variation of the frequency characteristic of the crystal resonator (electronic component 10) between before hermetic sealing and after hermetic sealing, it was found that variation of the frequency characteristic of the crystal resonator in the sample according to the example 4 greatly decreased as compared with the sample according the comparative example 2. This reason can be considered as follows. That is, in the sample according to the example 4, it can be considered that, since it has been possible to suppress that the solder layer 5 has wetly spread inward on the sealing surface of the hermetic sealing cap 1, it has been possible to suppress variation (deterioration) of the frequency characteristic of the crystal resonator caused by splatters of the solder that has wetly spread inward.

Second Embodiment

Figure 19:
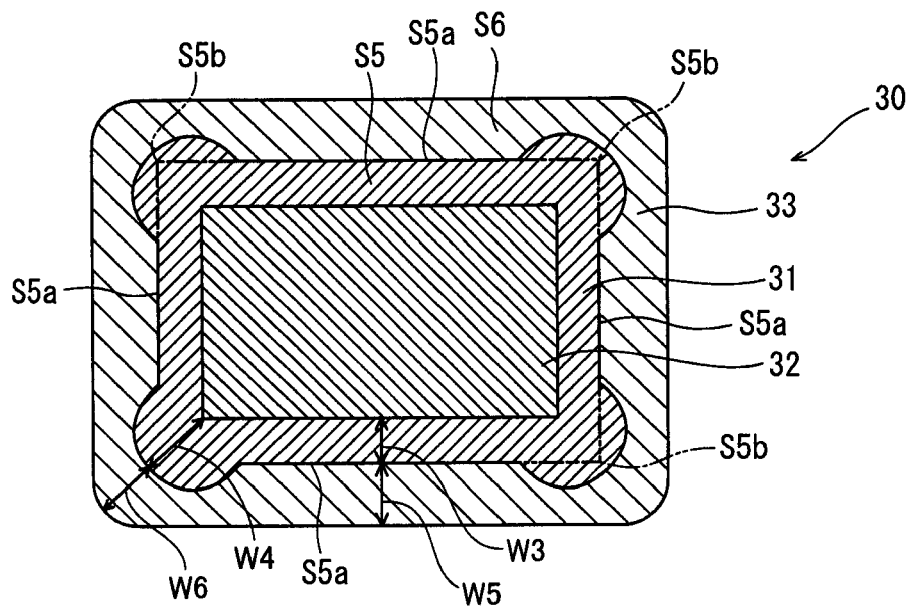
FIG. 19 Bottom view showing the structure of a hermetic sealing cap according to a second embodiment of the present invention.

With reference to FIGS. 1 and 19, in this second embodiment, the case where the shape of the area where the solder layer is formed is modified is described.

In the electronic component accommodation package according to the second embodiment of the present invention, similarly to the foregoing first embodiment, a hermetic sealing cap 30 (see FIG. 19) is joined on the upper surface of the ceramic frame 22 of the electronic component accommodation member 20 (see FIG. 1). In addition, the other parts of the electronic component accommodation package according to the second embodiment are similar to the foregoing first embodiment.

The structure of the hermetic sealing cap 30 according to the second embodiment of the present invention is now described with reference to FIG. 19. In the hermetic sealing cap 30 according to the second embodiment of the present invention, similarly to the foregoing first embodiment, in an oxidized area S5, an Au plating layer 32 is removed so that the surface of an Ni plating layer 31 is exposed, and the exposed surface of the Ni plating layer 31 is oxidized. Accordingly, in the oxidized area S5 on the bottom surface of the Ni plating layer 31, the solder wettability decreases. In addition, the Ni plating layer 31 corresponds to the "first plating layer" in the present invention.

Here, in the second embodiment, the oxidized area S5 of the Ni plating layer 31 is formed in a ring shape with a width W3 of about 0.20 mm, and is formed to have a width W4 slightly larger than about 0.20 mm around four corners of the hermetic sealing cap 30. In addition, the Au plating layer 32 is formed on an area inside the oxidized area S5 of the Ni plating layer 31. Additionally, the boundary between the oxidized area S5 of the Ni plating layer 31 and a joining area S6 is defined by a line that includes four straight line portions S5a that extend along the perimeter of the hermetic sealing cap 30. Furthermore, the Au plating layer 32 is an example of the "second plating layer" in the present invention. Moreover, a solder layer 33 is formed on the joining area S6 of the electronic component accommodation member 20 of the bottom surface of the Ni plating layer 31 to have a prescribed thickness.

In addition, in the second embodiment, the solder layer 33 (joining area S6) is arranged outside at least an intersection S5b of two of the straight line portions S5a of the oxidized area S5 of the Ni plating layer 31. In other words, in the boundary between the oxidized area S5 of the Ni plating layer 31 and the joining area S6, the boundary at the corners is arranged outside the boundary in the other area other than the corners. In addition, the solder layer 33 has a width of W5 of about 0.25 mm in other parts other than the corners of the hermetic sealing cap 30, and has a width W6 of about 0.265 mm at the four corners of the hermetic sealing cap 30. Thus, in the second embodiment, as compared with the foregoing first embodiment (width W1 at the corner: about 0.36 mm, and width W2 in the other part other than the corner: 0.25), it is possible to suppress that the solder layer 33 becomes large at the four corners of the hermetic sealing cap 30, therefore, it is possible to suppress that the solder collects at the four corners of the hermetic sealing cap 30. Consequently, it is possible to suppress that the thicknesses of the solder layer 33 at the four corners of the hermetic sealing cap 30 become large as compared with the thicknesses of the solder layer 33 in the other parts other than the four corners of the hermetic sealing cap 30.

In addition, production methods of the hermetic sealing cap 30 according to the second embodiment and the electronic component accommodation package are similar to the foregoing first embodiment, therefore, their description is omitted.

In addition, the other effects in the second embodiment are similar to the foregoing first embodiment.

Example

A comparative experiment is now described which has been conducted to confirm an effect of the hermetic sealing cap 30 according to the foregoing second embodiment. The comparative experiment is first described which has measured the thicknesses of the solder layer 33 after the hermetic sealing cap 30 has been produced. In this comparative experiment, a sample according to the example 5 corresponding to the second embodiment was produced, and was compared with the sample according to the example 1 corresponding to the foregoing first embodiment, and the sample according to the foregoing comparative example 1.

Figure 20:
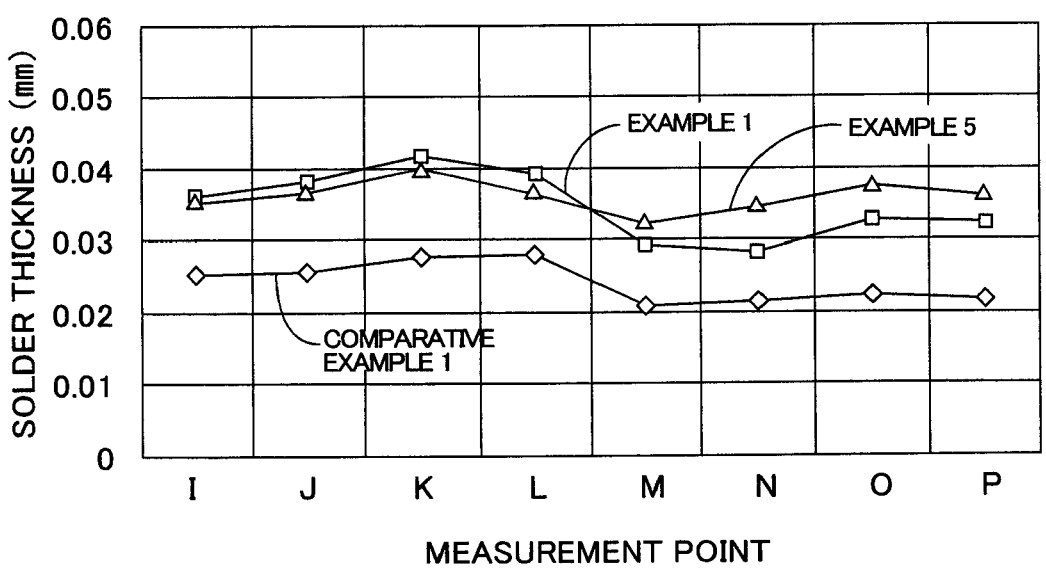
FIG. 20 View explaining the experiment that is conducted to confirm an effect of the hermetic sealing cap according to the second embodiment of the present invention.

The sample according to the example 5 was produced by using a production process similar to the hermetic sealing cap 30 according to the foregoing second embodiment. In addition, the sample according to the example 5 was produced by using the solder 5a that has a ring shape with a thickness of about 0.038 mm. The thicknesses of the solder layer 33 were measured in this sample. FIG. 20 shows the result.

With reference to FIG. 20, it was found that, in the sample according to the example 5, as compared with the sample according to the example 1, the differences between the thicknesses of the solder layer 33 at the measuring points (point I, point J, point K, and point L) at the four corners of the hermetic sealing cap 30 and the thicknesses of the solder layers 33 at the measuring points (point M, point N, point O, and point P) of the centers of four sides of the hermetic sealing cap 30 became smaller. This means that, since while the joining area S6 where the solder layer 33 has been formed has been formed in the width W5 of about 0.25 mm in the other parts other than the corners of the hermetic sealing cap 30, it has been formed in the width W6 of about 0.265 mm slightly larger than the width W5 at four corners of the hermetic sealing cap 30, in the example 5, as compared with the example 1 (width W1 at the corner: about 0.36 mm, and width W2 in the other part other than the corner: 0.25) that has had the larger width W1 at the corners, it has been possible to suppress that the solder layer 33 has become large at the four corners of the hermetic sealing cap 30. As a result, it has been possible to suppress that the solder has collected at the four corners of the hermetic sealing cap 30. Consequently, it can be considered that it has been to possible to suppress that the thicknesses of the solder layer 33 at the four corners of the hermetic sealing cap 30 has become large as compared with the thicknesses of the solder layer 33 in the other parts other than the four corners of the hermetic sealing cap 30. In addition, similarly to the sample according to the example 1, the thicknesses of the solder layer 33 in the sample according to the example 5 were larger than the thicknesses of the solder layer in the sample according to the comparative example 1.

It should be appreciated, however, that the embodiments and examples disclosed herein are illustrative in all respects, the invention is not limited to the embodiments and examples. The scope of the present invention is defined not by the description of the foregoing embodiments and examples but by the claims, and includes all modifications within the meaning and range of the claims, their equivalents, and the like.

For example, although the foregoing first and second embodiments show instances in which the solder layer is formed on the hermetic sealing cap to be joined to the electronic component accommodation member, the present invention is not limited to this. The solder layer may not be formed on the hermetic sealing cap to be joined to the electronic component accommodation member. In this case, when the hermetic sealing cap is joined to the electronic component accommodation member, solder may be arranged in a ring shape between joining parts of the hermetic sealing cap and the electronic component accommodation member to be melted.

In addition, although the foregoing first and second embodiments show instances in which the oxidized area of the Ni plating layer is formed to have a width of about 0.20 mm, the present invention is not limited to this. The oxidized area of the Ni plating layer may be formed to have a width other than about 0.20 mm. In this case, the oxidized area of the Ni plating layer is preferably formed to have a width not less than about 0.02 mm. In the case where the oxidized area of the Ni plating layer is thus formed to have a width not less than about 0.02 mm, it is possible to easily suppress that the solder layer that is formed outside the area where the Ni plating layer is oxidized wetly spreads over the area where the Ni plating layer is oxidized to come in contact with the Au plating layer that is formed inside the area where the Ni plating layer is oxidized.

In addition, although the foregoing first and second embodiments show instances in which the Au plating layer that is less oxidized than the Ni plating layer is formed on the surface of the Ni plating layer, the present invention is not limited to this. A plating layer that is composed of other metal that is less oxidized than the Ni plating layer may be formed on the surface of the Ni plating layer.

In addition, although the foregoing first and second embodiments show instances in which the Au plating layer is arranged on the area inside the area where the Ni plating layer is oxidized, the present invention is not limited to this. The Au plating layer may not be arranged on the area inside the area where the Ni plating layer is oxidized.

Moreover, although the foregoing first and second embodiments show instances in which an Au—Sn alloy (Au: about 80 mass %) is used as the solder layer, the present invention is not limited to this. The Au content in the solder layer may be a content percentage other than 80 mass %, and solder that is composed of other composition may be used.

The invention claimed is:

1. A hermetic sealing cap that is used for an electronic component accommodation package that includes an electronic component accommodation member for accommodating an electronic component, comprising:
    a base member;
    a first plating layer that is formed on the surface of said base member; and
    a second plating layer that is formed on the surface of said first plating layer and is less oxidized than said first plating layer, wherein
    at least a part of said second plating layer in an area inside an area to which said electronic component accommodation member is joined is removed so that the surface of said first plating layer is exposed, and the surface of said first plating layer that is exposed in the area from which said second plating layer is removed is oxidized.

2. The hermetic sealing cap according to claim 1, wherein said first plating layer is an Ni plating layer, and
    said second plating layer is an Au plating layer.

3. The hermetic sealing cap according to claim 2, wherein a solder layer that is composed of an Au—Sn group alloy is formed on the surface of at least one of said first plating layer and said second plating layer in the area to which said electronic component accommodation member is joined.

4. The hermetic sealing cap according to any one of claims 1 to 3, wherein
    the area of said first plating layer that is exposed and oxidized is formed in a ring shape as viewed in a plan view.

5. The hermetic sealing cap according to any one of claims 1 to 3, wherein
    said second plating layer is formed on an area inside the area of said first plating layer that is exposed and oxidized.

6. The hermetic sealing cap according to any one of claims 1 to 3, wherein
    in the boundary between the area of said first plating layer that is exposed and oxidized, and the area to which said electronic component accommodation member is joined, said boundary at corners of said hermetic sealing cap is located outside said boundary in other areas other than the corners of said hermetic sealing cap.

7. The hermetic sealing cap according to any one of claims 1 to 3, wherein
    the area of said first plating layer that is exposed and oxidized is formed in a groove shape with a prescribed depth.

8. An electronic component accommodation package comprising:
    a hermetic sealing cap that includes a base member, a first plating layer that is formed on the surface of said base member, and a second plating layer that is formed on the surface of said first plating layer and is less oxidized than said first plating layer, wherein at least a part of said second plating layer in an area inside an area to which an electronic component accommodation member is joined is removed so that the surface of said first plating layer is exposed, and the surface of said first plating layer that is exposed in the area from which said second plating layer is removed is oxidized; and
    said electronic component accommodation member that is sealed by said hermetic sealing cap and accommodates an electronic component.

9. A method for producing a hermetic sealing cap that is used for an electronic component accommodation package that includes an electronic component accommodation member for accommodating an electronic component, comprising steps of:
    preparing a base member;
    forming a first plating layer on the surface of said base member;
    forming a second plating layer being less oxidized than said first plating layer on the surface of said first plating layer; and
    oxidizing the surface of said first plating layer that is exposed by removing at least a part of said second plating layer in an area inside an area to which said electronic component accommodation member is joined so that the surface of said first plating layer is exposed.

10. The method for producing a hermetic sealing cap according to claim 9, wherein
    the step of forming said first plating layer includes a step of forming said first plating layer that is composed of an Ni plating layer, and
    the step of forming said second plating layer includes a step of forming said second plating layer that is composed of an Au plating layer.

11. The method for producing a hermetic sealing cap according to claim 10, further comprising a step of joining a solder layer that is composed of an Au—Sn group alloy on the surface of said second plating layer in the area to which said electronic component accommodation member is joined by melting the solder layer.

12. The method for producing a hermetic sealing cap according to any one of claims 9 to 11, herein
    the step of oxidizing the surface of said first plating layer includes a step of exposing the surface of said first plating layer by removing at least a part of said second plating layer by using laser without masking said second plating layer in the area to which said electronic component accommodation member is joined.

13. The method for producing a hermetic sealing cap according to any one of claims 9 to 11, wherein
    the step of oxidizing the surface of said first plating layer includes a step of exposing and oxidizing the surface of said first plating layer in a ring shape.

14. The method for producing a hermetic sealing cap according to any one of claims 9 to 11, wherein
    the step of removing at least a part of said second plating layer includes a step of removing said second plating layer with leaving said second plating layer inside the area from which said second plating layer is removed in place.

15. The method for producing a hermetic sealing cap according to any one of claims 9 to 11, wherein
    the step of oxidizing the surface of said first plating layer that is exposed includes a step of forming the area of said first plating layer that is exposed and oxidized so that the boundary between the area of said first plating layer that is exposed and oxidized, and the area to which said electronic component accommodation member is joined at corners of said hermetic sealing cap is located outside said boundary in other areas other than the corners of said hermetic sealing cap.

16. The method for producing a hermetic sealing cap according to any one of claims 9 to 11, wherein
the step of exposing the surface of said first plating layer by removing at least a part of said second plating layer includes a step of removing at least a part of said second plating layer and removing also a part of the surface of said first plating layer at a prescribed depth.

* * * * *